United States Patent [19]

Scarr

[11] Patent Number: 4,701,879
[45] Date of Patent: Oct. 20, 1987

[54] ASSOCIATIVE MEMORY SYSTEMS

[75] Inventor: Robert W. A. Scarr, Stansted, United Kingdom

[73] Assignee: Standard Telephones and Cables Public Limited Co., London, England

[21] Appl. No.: 747,717

[22] Filed: Jun. 24, 1985

[30] Foreign Application Priority Data

Jul. 5, 1984 [GB] United Kingdom ............... 8417187

[51] Int. Cl.$^4$ ............................................. G11C 13/00
[52] U.S. Cl. .................................... 365/49; 365/126; 365/106
[58] Field of Search ................ 365/49, 106, 120, 126

[56] References Cited

U.S. PATENT DOCUMENTS 3,572,881 3/1971 Nishida ............................ 365/124
3,841,729 10/1974 Ando et al. ...................... 365/127

Primary Examiner—Terrell W. Fears
Attorney, Agent, or Firm—Kerkam, Stowell, Kondracki & Clarke

[57] ABSTRACT

An associative (content addressable) optical memory system is comprised by a matched optical holographic filter (10, 18, 21, L1, L2) coupled to a digital computing system (14, 15, 16) having a memory (15, 16). In order to search the computing system memory for occurrences of an item, a hologram of a binary representation of the item is formed in the Fourier transform plane (18) employing laser (11) as the light source. A page of the memory to be searched is subsequently displayed at the input plane (10), which for example is comprised by a liquid crystal over silicon display, and illuminated by the laser (11). The light is filtered at the Fourier transform plane (18). Any occurrences in the input plane display of the item result in a respective correlation spot at the output plane, which spot output is decoded and supplied to the processor (14), thus providing correlation information to the computing system as to the location in its memory of the occurrences of the item.

13 Claims, 3 Drawing Figures

ASSOCIATIVE MEMORY SYSTEMS

BACKGROUND OF THE INVENTION

This invention relates to associative memory systems, that is to say content addressable memory systems, and in particular to associative optical memory systems.

SUMMARY OF THE INVENTION

According to one aspect of the present invention there is provided an associative optical memory system comprising an optical imaging system, in the form of a matched optical holographic filter, and, coupled thereto, a digital computing system including a memory, and wherein in use for searching the computing system memory for occurrences of an item the computing system controls the input and Fourier transform planes of the filter and a coherent light source for parallel optical processing of the memory content, and the output plane of the filter provides information to the computing system as to the location in the memory of occurrences of said item.

According to another aspect of the present invention there is provided an associative optical memory system comprising a matched optical holographic filter, including an input plane comprised by a liquid crystal over silicon display, a Fourier transform plane and an output plane, the planes being separated by thin spherical lenses, and a coherent light source, and a digital computing system including a processor and a direct memory access element loaded by a backup store, which computing system is coupled to the filter for controlling the input and Fourier transform planes and the light source for parallel optical processing of the memory content, the output plane providing information to the processor as to the location of occurrences in the memory of a searched for item, wherein in use of the memory system a page of the memory content is loaded into the input plane, stored and the display blanked, a representation of the item to be recognised is loaded into a defined area of the display and a hologram thereof recorded in the Fourier transform plane by a pulsed reference beam derived from the coherent light source, wherein the loaded page is then displayed and illuminated by another beam derived from the coherent light source, wherein the light is filtered in the Fourier transform plane, detected at the output plane, decoded and passed to the processor for use in determining the location in the memory of the input display of the occurrences.

BRIEF DESCRIPTION OF THE DRAWINGS

Embodiments of the invention will now be described with reference to the accompanying drawings in which.

DESCRIPTION OF THE PREFERRED EMBODIMENTS

Figure 1:
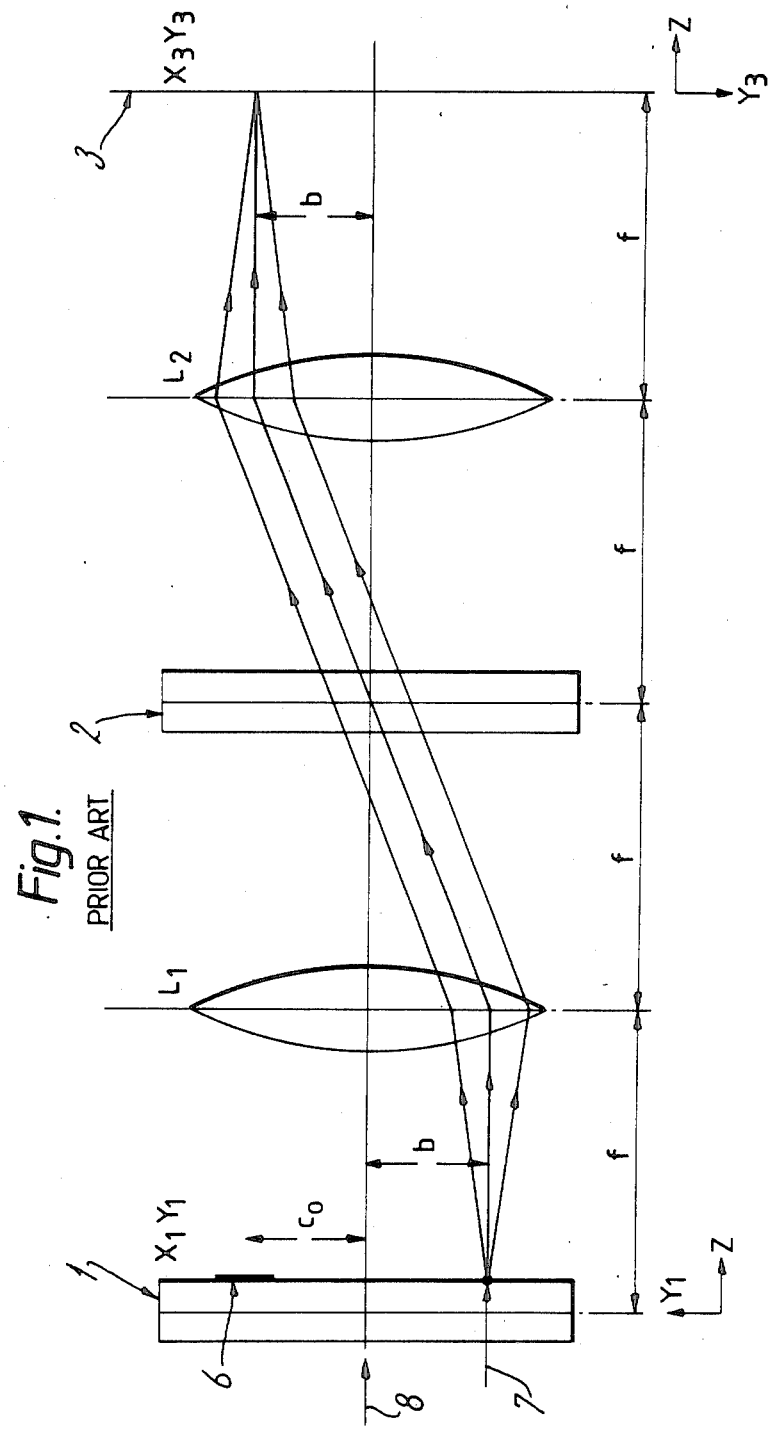
FIG. 1 illustrates a matched filter double Fourier transformation one-to-one imaging system (prior art)

Optical holographic techniques give high potential for parallel processing and while much attention has been paid to holography for mass storage of digital data, little attention has been paid to the parallel processing of digital information by such techniques.

Data stored in an immediate access memory of a Von Neumann computer can be organised in many ways from one extreme of all data being at specified locations, to the other extreme of searching through the complete data memory to find the required item or items. Most software involving a data base of appreciable extent is organised to restrict the search by arranging the data in a logical manner, so that an algorithm can be written to reduce the search from a complete set of data items to a subset. Techniques such as arrays, indexes, buffers, linked lists, indexed sequential files are employed to achieve this aim. Nevertheless, there is a limit to what can be practically achieved by algorithms, and an element of searching item by item for the required degree of match is necessary in many applications.

With a Von Neumann architecture the memory is directly addressed by location and the searching is a step by step serial process. Associative processors, on the other hand, can generally be described as being characterised such that data can be found according to what they are, rather than the memory addresses at which they are stored, and such that logical operations can be performed over many sets of arguments at the same time with a single instruction. To do this effectively, either very high speed serial or parallel processing is required. Early associative (or content addressable) stores were high speed serial, but there is a move towards parallel processing using arrays of processors.

An example of such an array of processors is based on the transputer. Transputers are Von Neumann machines that can be connected in an array. Each machine has its own memory and searching can be done in parallel across as many machines as is desired. However, each machine searches in a serial fashion through its own memory. Clearly the efficiency of this process is dependent on the distribution of the information requiring to be searched between the processors in the array. If the search is localised to one or a few machines, the rest may be held up waiting for the answers. If the information is unduly distributed this would imply that the application is one which is suited to a wide distribution of the information. These considerations may give to conflicting design constraints affecting the array harness and the functional division between processors.

Another approach is to use what is called "data flow processors" where the order of execution of the operators of a program is determined solely by the data dependencies. It is possible for the operations to be executed in many different orders and, in particular, far more than one instruction to be executed concurrently and hence, with a large number of processors, parallelism can be exploited. The applications of this approach appear to be primarily high speed computation, rather than data base management or information handling. Reduction machines are another possibility of which there are two basic varieties, i.e. string and graph. The string reduction machines depend for their efficiency on organising the program and data in a tree structure. They are special purpose machines suited to applicative languages. The graph reduction machine is also suited to applicative language and works in terms of packets. A packet pool takes the place of a random access memory and a multiprocessor system processes those packets which contain information on the operations to be performed and the data to be used in that performance.

Most if not at all of the above approaches are tackling compute bound problems rather than memory bound problems. Signal processing and arithmetic computation are inherently compute bound (a large amount of processing on a relatively small amount of data). Data retrieval in intelligent knowledge based systems can be made into compute bound problems by complex linking of the data in, for example, a hierarchy tree structure, or they can become memory bound if simpler structures involving more searching are invoked. All problems are memory bound while the data required is on a backing store.

There is a case, therefore, for exploring solutions to memory bound problems as well as compute bound problems. While there is an element of competition between the two approaches, they should be capable of being made to compliment each other. To simplify the following, it will be assumed that the memory to be described interfaces with a conventional computer architecture, but that is not an overriding constraint.

Memory organisation at present is largely dictated by economic considerations and is hierarchical. In general, the cost of storage decreases as the access time increases. Hence the hierarchy; tape, disc (or drum), magnetic bubble, semiconductor, in increasing cost per bit and decreasing access time. All of these memories are serial access in terms of words, bytes or bits. There is no memory that is parallel in terms of more than a few multiple words.

The normal method of retrieving information that is stored outside of the immediate access memory, is for the central processor to request a peripheral to put into the immediate access memory a specified file, record or set of records. The central processor keeps some sort of index of the whereabouts of the relevant information and the peripheral usually searches and finds the exact information and loads it. This can be done autonomously if the processor has a DMA (direct memory access) feature.

Once loaded, a more detailed search is often necessary to find a file with a particular value in a set of data items. Such a search might advantageously be carried out as a parallel operation over a number of fields simultaneously.

Optical techniques are potentially capable of a very high level of parallel processing and have been used for some years in the processing and recognition of visual analogue information. Optical techniques are also used for the storage of digital informatin. However, optical techniques appear not to have been used for the recognition of digital information.

Optical storage of digital information may be divided into two broad categories: (a) using holographic techniques and (b) using direct recording of binary information. Much work has been done on the former with very little commercial success. The latter, because of its commonality with home video recording, shows considerable prospect of providing storage media which is a competitor to magnetic disc. Direct recording lends itself to serial read out or limited parallel read out of information, whereas holography lends itself to full parallel read out. Direct recording is a surface recording. Holographic recording can be either a surface or a volume recording, and in the latter case can lead to very high information densities. Direct recording is very sensitive to local imperfections in the vicinity of the recording medium (e.g. dust) whereas holography is not. Both approaches use recording media that are more suited to read only rather than read/write storage. Although both techniques involve lasers, holography is much more dependent on a coherent light source. Holographic equipment is bulky because it usually involves lenses with long focal lengths and needs very precise and stable dimensioning. Direct recording needs even more precise and stable dimensioning and usually involves rotating parts but the optical system is simpler. The reason that direct recording has been used for video recorders in the home entertainment market is probably because of the simpler optics and the lack of suitable detectors to cope with highly parallel outputs. these considerations do not weigh so heavily for data processing.

The present invention is not, however, concerned with high density optical storage, for which there are many possibilities not necessarily using holography, but rather with the parallel processing of information using holographic techniques, and carrying parallel processing one stage further than hitherto from the memory towards the processor so that parallelism can be used to provide rapid search facilities for matching fields in relatively complex data structures or for individual items.

The basis of much work on optical pattern recognition is the matched filter, sometimes called a "Vander Lugt" filter, illustrated in FIG. 1. The filter contains three planes 1, 2 and 3 all of which are situated at the foci of two thin spherical lenses L1 and. L2. Plane 1 is called the input plane, plane 2 is called the spatial frequency plane or Fourier transform plane (FTP) and plane 3 is called the output plane. Lense L1 acts to provide the Fourier transform of images in the input plane 1 at the Fourier transform plane 2, and the lense L2 acts to provide the inverse Fourier transform of images at the Fourier transform plane 2 and the output plane 3. The Fourier transform of a real image at the input plane 1 which is illustrated by coherent light is an interference pattern or hologram. The input plane 1 contains spatial information in two dimensions, and the FTP, plane 2, contains spatial frequency information in two dimensions. Just as an electrical signal can be broken into frequency components by a Fourier transform, visual patterns can be treated likewise. Electrical signals are, however, usually one dimensional, whereas optical information is two or three dimensional. The concern here is with two dimensional optical information, such as displayed on a page of print, for example.

The first stage in the production of a filter is to record a hologram in the FTP, plane2, corresponding to the information to be recognised. To do this a representation of the information to be recognised (image 6) is placed in the input plane 1, centred, say, at $c_0$ and a point source reference beam indicated by arrow 7 is located at $x=0$, $y_1 = -b$. The coherent light source used to illuminate the image 6 is coherent with the reference beam 7 and hence differs from it only in amplitude and phase. The resultant hologram in the FTP is recorded, for example, on a photo sensitive medium as a plane hologram transparency. The lens L2 and the output plane 3 are not required for this process.

Having recorded the hologram of the information to be recognised, it being disposed in the FTP, plane 2, a set of unknown patterns is placed in the input plane 1 and illuminated by coherent light of the same wavelength as is used in the recording process. Now, a basic property of a hologram is that if it is recorded by illumination of two scenes S1 and S2 and then exposed to light from S1, a real or virtual image of S2 will result, and vice versa. In the matched filter a real image is produced at the output plane 3. S1 can be regarded as the point source, and S2 initially as the information being recorded and latterly as the unknown pattern. If the unknown pattern contains the information to be recognised, the result will be a representation of the point source in the output plane 3. This represents the autocorrelation, or matching, of the input to the filter. With suitable design, the autocorrelation spot will be more intense than any cross correlation terms and a peak detector can determine its presence and position in the output plane. Its position in the output plane bears a one-to-one correspondence with its position in the input plane. For example, if its position in the input were to be exactly the same as the position when the hologram was made, the spot would be at $x=0$, $y_3=-b$ (note the inversion of the axes). This can be regarded as the reference point and the displacement of the spot from that reference point is a direct measure of its displacement in the input scene from the original position.

There are a number of strategies for making use of matched filter techniques for optical character recognition, as discussed for example in "Optical Holography" R. J. Collier, C. B. Burckhardt, L. H. Lin, Academic Press 1971. The strategy depends the need to recognise:

(a) The position of items $x_1, x_2 \ldots x_n$ in a scene made up from a set of n items with an arbitary number of repetitions of each item (e.g. printed character recognition).

(b) The presence and position of one item against an unspecified background (e.g. military applications of tank detection).

(c) The presence of a number of examples of one item from a set of n items (e.g. searching for one binary pattern in a set of n binary patterns).

Although (a) is more general than (c), there are practical reasons why (even when the application requires it) searching for items one at a time rather than many together may be preferable. However, (c) implies a different matched filter for each item sought and it is then necessary to be able to change matched filters very rapidly if this approach is to be adopted effectively.

A basic problem of this type of optical processing is, therefore, that while the processing is very fast once the information is in the optical filter, actually getting it into position may provide an unacceptable bottleneck.

The most widely used holographic recording material is silver halide photographic emulsion. This is satisfactory from the point of view of resolution and contrast range but needs chemical processing and implies complex mechanical handling problems if filters are to be changed.

There are many other possibilities, some of which do not require chemical processing, for example ferro electric crystals, inorganic photochromic materials, thermoplastic materials (require a developing process which is, however, fast by photographic standards), magneto-optic materials, ferroelectric photoconductor, liquid crystal/photoconductor and thermally-written smectic liquid crystal. Our co-pending GB Application No. 840482 (Ser. No. 699,980 filed 2/8/85) (W. A. Crossland—R. W. A. Scarr 44-31) relates to optical processors using a transmission type smectic liquid crystal display in the FTP.

Recording holograms by optical means is not, however, the only possibility. It is also possible to generate holograms by a computer if the patterns to be handled are of sufficient simplicity. Binary patterns can be regarded as arrays of point sources. Such holograms may be generated once, stored in binary form and loaded as required onto a suitable display. Alternatively they could be computed at run time and loaded. However, the time necessary to load the information, if this is done serially may negate advantages obtained by subsequent parallel processing.

For the purposes of the following description the holograms will be assumed to be recorded by optical means in an undefined recording media. This being so, together with the fact that a very fast means of production is required, implies that (a) the hologram is recorded by a transient laser pulse of high energy and short duration (microsecond or submicrosecond), (b) that hologram is read by a transient pulse which may be of lower energy than the recording pulse, (c) the read is preferably but not necessarily non-destructive, (d) the hologram storage need not be permanent and can decay in times of the order of milliseconds, (e) the duty cycle of the laser, particularly on recording, is sufficiently low that means power level limitations are not exceeded, and (f) erasure and recording may be one operation or two depending on the recording medium.

The parallel processing of a "page" of memory displayed at the input plane will now be considered, the memory "page" being equivalent to the set of unknown patterns referred to above. The entries on the "page" are in the form of "words" of n bits. For the purposes of illustration n will be taken as 8, but in principle it can be any number. Ideally any concatenation of words should be recognisable and it should be possible to mask bits, for example one may be interested in the last m bits of a word and the first n-m bits are of no account and can be "masked out". There are thus four conditions to be recognised: a logical 0 a logical 1, a don't care and delimiters or a frame defining the boundaries of a word. It is necessary to have an arrangement that will cope with all bit patterns without aliasing, that is there must be a zero possibility of a pattern being generated and registered correctly that is an unintentional representation of the one being sought, thus implying a fairly high order of redundancy. The problem that a different pattern in the y dimension might alias the required pattern in the x direction can be avoided by recording and processing in the presence of a fixed but limited pattern, possibly around the edge of the display.

Figure 2:
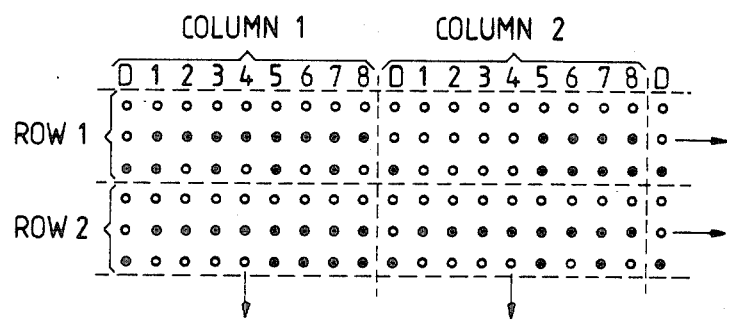
FIG. 2 illustrates a possible representation of binary information.

FIG. 2 shows an example of a word design in which a computer word of 8 bits is represented by 27 bits on the display, the invention, however is not to be considered as limited to 8 bit words, any length may be used. A black dot represents the presence of illumination and a clear dot its absence. The 8 bit words are arranged in rows and columns, only four words being indicated in FIG. 2. Each word is comprised by three sub-rows and nine sub-columns and begins with a column word delimiter (sub-column D) comprised by a sub-column of two clear dots followed by a black dot as indicated. Each first sub-row of a word is comprised by nine clear dots, thus acting as a row word delimiter. To facilitate understanding of FIG. 2 dashed lines have been drawn to delimit the four words thereof. The word occupying the row 1, column 1 is (10101010) i.e. hexadecimal AA; that in row 1, column 2 is (MMMM1111) where M means masked i.e. hexadecimal XF where X is any value; that in row 2, column 1 is (00001111) i.e. 0F and that in row 2, column 2 is (00001010) i.e. 0A.

The "page" of memory in the input plane can be loaded from a computer's electrical memory, in which case the computer will keep a map relating the contents of the input plane to its internal memory. Such a map would be a simple linear translation from one medium to the other. Alternatively, the page of memory may be the direct output of an optical (holographic) store projected onto the input plane. If so, the information would be processed as described below, and then loaded into an electrical memory if an item being sought was present in the page being displayed. A third possibility is the direct loading of the input plane from a magnetic backing store using direct memory access (DMA). Here there is the possibility of either loading an immediate access memory afterwards if an item is found, or loading the immediate access memory is parallel with loading the input plane. Input displays that take the form of liquid crystal over silicon can store the information for display and allow simultaneous read access to it by a processor.

The interface between the backing store and the display (input plane) must allow for the fact that the binary information needs to be displayed in a redundant format and must provide the necessary translation arrangement. Direct interfacing to a holographic store implies that the information in that store would be in the same redundant format as is required for the display. By selecting the appropriate fields (e.g. the bottom elements of each row and the relevant columns in FIG. 2), the information can be read out of a liquid crystal display store as pure binary information.

The matched filter, which is to be put in the FTP, is a recording of the word pattern sought together with its delimiters. If masking of words is required this is done on recording. The presentation of the word to be recorded can be placed at any arbitrary point on the display (input plane) although on the basis of symmetry it is sensible to place the reference beam at the exact centre of the display and on the focal axis of the system ($x=y=o$). The intensity of the reference beam should be much greater than that of the other individual point sources representing the binary numbers, in order that the autocorrelation terms be larger than the cross correlation terms at the output plane.

The output plane may contain an array of photodetectors or be comprised by a homogeneous photosensitive plane such as provided for a TV camera. If photodetectors are used, there is one for every word stored on the input plane located at a position corresponding to the possible position of the words in the input plane. It is assumed that word boundaries are fixed points at the input plane and information is, therefore, fixed within a grid set by these word boundaries. If a photosensitive plate is used its photosensitive storage media would be scanned to locate the amplitude and position of maxima in the output plane. In either case a replica of the word being sought may be placed at a known point on the input plane so as to act as a reference for determining the level at which to set the correlation threshold. This enables correction to be made automatically for variation in the intensity of illumination of the input plane.

The positions of valid maxima in the output plane are conveyed to the processor which translates them into addresses in its own memory, which may also be the input plane, where the items identified can be found and processed.

The only logical operation the arrangement is capable of performing is "search on masked equality". Whereas semiconductor logic in memory arrangements are capable of such operations as searching for less than, or greater than, and performing logical and arithmetic operations on operands when found, an optical arrangement can only locate the relevant locations, however, it can do these in combinations which the semiconductor logic in memory arrangements is less well able to do. For example, a set of personnel records might be scanned as one operation to find all the persons named Brown with two children and red hair.

From consideration of the search times of a conventional Von Neumann machine and of an optical correlator attached to a Von Neumann machine it is apparent that a very fast means of producing holograms, of the microsecond order, is required; that the optical correlator is most disadvantaged when the information to be scanned is already in an immediate access memory and a single scan of the material is required; that the optical correlator is advantaged when the information is on a backing store and multiple passes or combinations of words in fixed relationships are sought; and that the optical correlator is further advantaged when the backing store material is already in an optical format. In drawing these conclusions it was assumed that, when the information is on a backing store, the limitation is set by the speed of reading that store rather than any limitation on loading the information into the input plane. It is also assumed that processing of information at the output plane can be done at speeds comparable with a conventional processors memory cycle time.

Compared with the resolution required for holographic optical lenses, the resolution requirements of the recording in the FTP are not onerous. Furthermore, there is no basic requirement to work in the visible range and operation in the infra red can be beneficial if resolution of the holographic recording media is limited.

There are a wide range of possible laser sources which may be used for producing holograms in the FTP. The parameters of a laser which need to be considered are the peak power under pulsed operation and duty cycle, wavelength and spectral distribution of energy. In general, a very highly coherent source is not compatible with high peak power outputs, and it is considered that the high coherence required for monomode communications systems is not necessary. Consideration of hologram resolution points to a source in the infra red rather than the ultra violet. Nd:YAG lasers provide outputs in the 1 $\mu$m region and $CO_2$ lasers in the far infra red, about 10 $\mu$m.

Photodetection in an array or a homogenous photosensitive plate have been referred to above for use in the output plane for detecting correlation peaks. An array of diodes is presently considered preferable since they are all solid state and the processing of their outputs is relatively straightforward. The diode array may be fabricated on a single chip. The density of the detectors would be relatively low, only one being needed per word, so that chip utilisation would be poor. However, the chip could also contain processing circuitry to present correlation peak positions across a defined interface. All of the diodes on the chip would need to have uniform sensitivity and whilst silicon would be ideal from a fabrication point of view the fall-off in its photosensitivity at the infra red end of the spectrum could be disadvantageous.

The above description has covered various approaches to the design of an associative optical memory, that is to say an associative memory arrangment of large capacity based on the use of a method holographic filter connected to a digital computing system, a specific system incorporating presently preferred options will now be described with reference to the block diagram of FIG. 3.

An input plane is comprised by a liquid crystal over silicon display 10 incorporating a pleochroic dye and working in a similar manner to that described in British Patent Application No. 8209710 (Ser. No. 2118247A) (W. A. Crossland et al 35-13-7-5). A major difference, however, is that the reference light source derived from the output of laser 11 is coupled by an optical fibre 12a, 12b through a hole in the centre of display 10. A means of turning the reference light source on or off is required and is illustrated as an optical modulator 13 in series between fibre sections 12a and 12b. The optical modulator may be a solid state electro-optic device. Alternatively the reference light source may be switched on or off by some form of liquid crystal device employed as a shutter. The system includes lens L1 and L2 equivalent to lenses 4 and 5, respectively, of FIG. 1.

To record a hologram a processor 14 loads a representation of the bit pattern to be recognised into a defined area of the input display 10. The rest of the input display is blanked, its content (the input page of memory to be searched) having been previously loaded, from backing store 15 via DMA 16, and stored. The optical modulator 13 is switched on via control line 17. If necessary the processor 14 sets the material in the FTP 18 and comprising a dynamic hologram recording medium into the "ready for record" state, as for example in the case of a ferroelectric crystal, via control line 19. The laser 11 under command by the processor 14 gives a high energy pulse (reference beam) to illuminate the representation of the bit pattern to be recognised (via lens L4, fibre 12a,12b and modulator 13) and the hologram thereof is recorded in the FTP 18. The optical modulator 13 is then switched off by command of the processor whereby to turn the reference beam off at the display 10.

On command from the processor the input page of memory to be searched is displayed on display 10 and the laser 11 gives a low energy output pulse which via lens L4, lens L3 and beam splitter 20 illuminates the input page on display 10. Lenses L3 and L4 comprise a beam collimater. The light is filtered in the FTP 18 and detected by photosensitive matrix, e.g. a silicon diode array, at the output plane 21. The output information is decoded and passed back to the processor as correlation information 22, which processor 14 can then locate in the memory of the input display, the DMA 16 being coupled to the processor as shown, the items that have been recognised.

When the processor has finished processing the information in the input plane, which may involve several cycles as outlined above, each cycle being employed for locating a respective item, the input plane (display 10) is reloaded with fresh material via the DMA 16 from the backing store 15. The processor is free to carry out other operations while the DMA Loading is taking place.

The data (memory) page capacity of the system can be limited by optical resolution, or fabrication limitations, in any one of the three planes i.e. the input, the Fourier transform and the output plane. However, because the output plane resolution that is required is one bit per word, this is unlikely to be the limitation. The size of the display (input plane) is limited if, as proposed, a liquid crystal over monocrystalline silicon display is used. A four inch (10 cm) wafer of such material might allow some 50 square cm of useful area. If, as in British Application No. 8208710, a transistor and a grid of connections are required behind each element in two out of three rows, assuming the arrangement of FIG. 2, the minimum size of each element will be, say, 10 micron square. This would give a potential for $5 \times 10^7$ elements, corresponding to $1.4 \times 10^7$ bits of stored information (8 bit words).

The theoretical limit for storage in the FTP is of the order of $18 \times 10^7$ elements, or $5.3 \times 10^7$ bits of stored information, assuming light of a wavelength of 1 micron, no limitation set by hologram definition, the same 50 square cm area for storage, and a plane hologram.

The practical limit for data page capacity is therefore determined by the input plane, where an ability to fabricate successively a number of elements of the $10^7$ order is beyond the current state of the art. Techniques involving redundancy and selection on test as used on bubble memories may ease this problem, but are limited by the fact that information being searched for must always have the same relative geometry irrespective of its location on the display.

Figure 3:
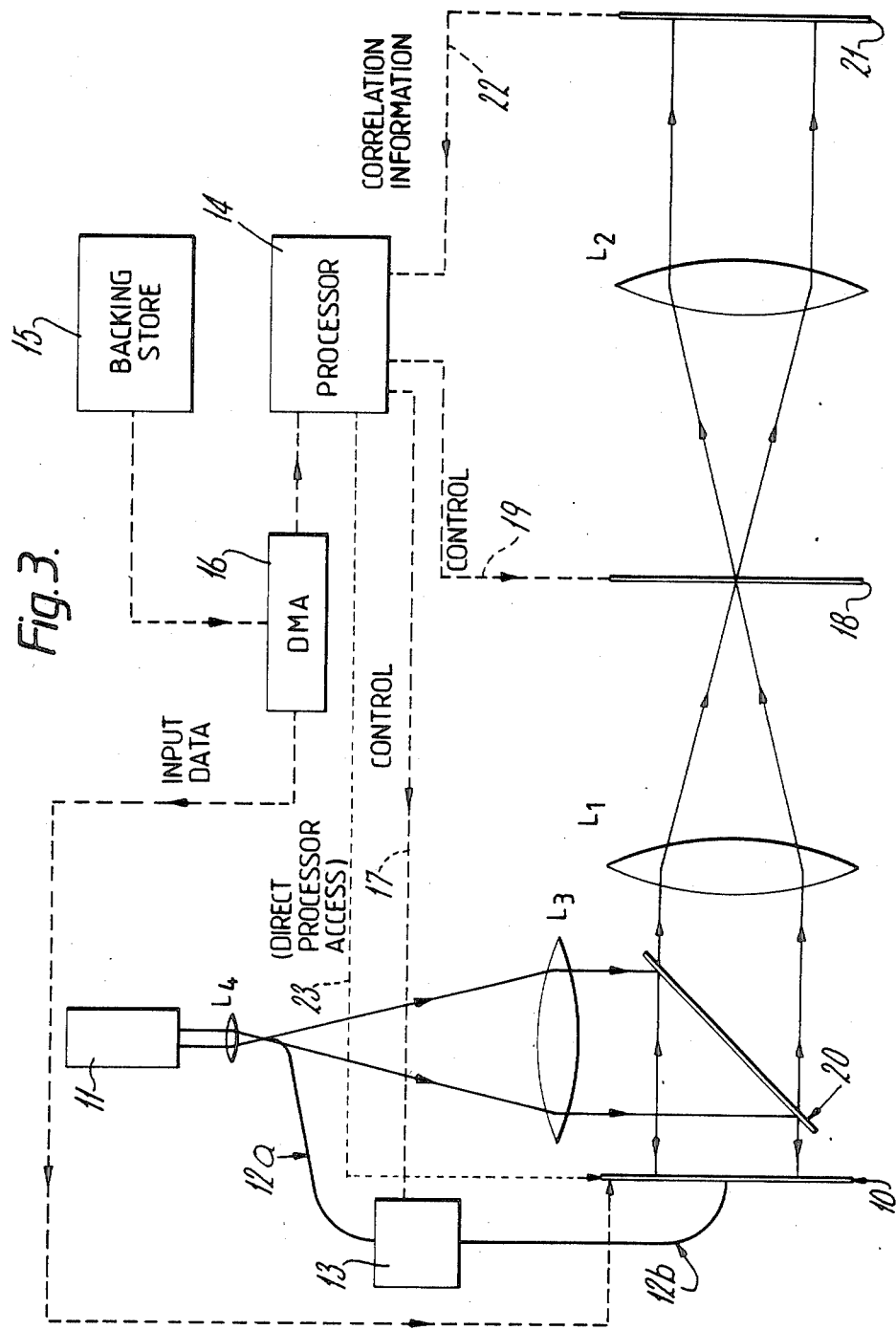
FIG. 3 illustrates a system block diagram of an associative optical memory.

If capacity is limited at the input plane rather than the FTP, the area of the FTP can be less than that of the input plane, implying an asymmetrical lens L1 in FIG. 3, thus reducing the power requirements needed to produce the hologram.

The processor has the ability to access directly a liquid crystal over silicon version of the input plane, which acts as its memory, as mentioned above, this alternative being indicated by the dotted line "direct processor access" 23 between processor 14 and plane 10.

Thus the present invention proposes an associative optical memory system and the requirements of the component parts of such an arrangement have been outlined. Such systems lend themselves to the parallel processing of millions of bits in the search for a particular item of information. The associative memory concept as outlined is largely complementary to advanced processor architecture and is relevant to 5th generation computers with extensive knowledge/data bases.

I claim:

1. An associative optical memory system comprising an optical imaging system, a coherent light source and a digital computing system including a memory, the optical imaging system being in the form of a matched optical holographic filter having an input plane, a Fourier transform plane and an output plane, the computing system being coupled to the filter and including means for controlling the input plane, the Fourier transform plane and the coherent light source for parallel optical processing of the memory content in order to search for occurences of an item in the memory, the output plane having an output providing information to the computing system controlling means as to the location in the memory of occurences of said item, said controlling means serving to form a hologram of said item in the Fourier transform plane, using said coherent light source as the light source for the hologram formation, and the controlling means serving subsequently to display the memory content at the input plane and to illuminate it with said coherent light source, the Fourier transform plane serving to filter light from the input plane, any occurence in the input plane display of said item resulting in a corresponding output in the output plane which is detected and provided as said information to the computing system means.

2. A memory system as claimed in claim 1, wherein a processor of the computing system comprises said computing system controlling means, and wherein said memory includes a direct memory access element loaded by a backing store.

3. A memory system as claimed in claim 1, wherein the coherent light source is comprised by a laser the optical output of which can be supplied to illuminate the input plane or which can be supplied as a reference beam to the input plane.

4. A memory system as claimed in claim 3, wherein the reference beam is supplied to the input plane via an optical fibre including an optical modulator therein.

5. A memory system as claimed in claim 1 wherein the input plane is comprised by a liquid crystal over silicon display.

6. A memory system as claimed in claim 1, wherein the input plane is comprised by a liquid crystal over silicon display which also comprises the digital computing system memory.

7. A memory system as claimed in claim 1, wherein the Fourier transform plane is comprised by ferroelectric crystal or thermally written smectic liquid crystal.

8. A memory system as claimed in claim 1, wherein the output plane is comprised by an array of photodiodes.

9. A memory system as claimed in claim 1, wherein said item is comprised as a specific binary pattern or patterns, wherein the memory is configured in the input plane as a plurality of binary patterns, and wherein said matched filter serves to locate the specific binary pattern or patterns against a background of the plurality of binary patterns.

10. A memory system as claimed in claim 9, wherein the binary patterns are defined with a redundant coding scheme that permits discrimination without aliasing.

11. A memory system as claimed in claim 9, wherein each binary pattern comprises a computer word of 8 bits represented at the input plane as 27 bits comprised by three rows of nine bits, the first row and first column of which serve to delimit words from one another.

12. A memory system as claimed in claim 11 and wherein the columns other than the first represent logical 0, logical one or don't care (masked).

13. An associative optical memory system comprising a matched optical holographic filter, including an input plane comprised by a liquid crystal over silicon display, a Fourier transform plane and an output plane, the planes being separated by thin spherical lenses, and a coherent light source, and a digital computing system including a processor and a direct memory access element loaded by a backup store, which computing system is coupled to the filter for controlling the input and Fourier transform planes and the light source for parallel optical processing of the memory content, the output plane providing information to the processor as to the location of occurrences in the memory of a searched for item, wherein in use of the memory system a page of the memory content is loaded into the input plane, stored and the display blanked, a representation of the item to be recognised is loaded into a defined area of the display and a hologram thereof recorded in the Fourier transform plane by a pulsed reference beam derived from the coherent light source, wherein the loaded page is then displayed and illuminated by another beam derived from the coherent light source, wherein the light is filtered in the Fourier transform plane, detected at the output plane, decoded and passed to the processor for use in determining the location in the memory of the input display of the occurrences.

* * * * *